United States Patent
Bintang

(10) Patent No.: US 9,337,111 B2
(45) Date of Patent: May 10, 2016

(54) APPARATUS AND METHOD TO ATTACH A WIRELESS COMMUNICATION DEVICE INTO A SEMICONDUCTOR PACKAGE

(71) Applicant: STMicroelectronics Pte Ltd., Singapore (SG)

(72) Inventor: Yohanes Bintang, Batam (ID)

(73) Assignee: STMicroelectronics Pte Ltd, Singapore (SG)

(*) Notice: Subject to any disclaimer, the term of this patent is extended or adjusted under 35 U.S.C. 154(b) by 263 days.

(21) Appl. No.: 13/853,496

(22) Filed: Mar. 29, 2013

(65) Prior Publication Data

US 2014/0291867 A1    Oct. 2, 2014

(51) Int. Cl.
| | |
|---|---|
| *H01L 23/48* | (2006.01) |
| *H01L 23/52* | (2006.01) |
| *H01L 29/40* | (2006.01) |
| *H01L 21/66* | (2006.01) |
| *H01L 23/31* | (2006.01) |

(52) U.S. Cl.
CPC ............... *H01L 22/14* (2013.01); *H01L 22/20* (2013.01); *H01L 23/3128* (2013.01); *H01L 2224/32145* (2013.01); *H01L 2224/32225* (2013.01); *H01L 2224/73265* (2013.01); *H01L 2225/0651* (2013.01); *H01L 2225/06562* (2013.01); *H01L 2225/06575* (2013.01); *H01L 2225/06589* (2013.01); *H01L 2225/06596* (2013.01); *H01L 2924/15311* (2013.01)

(58) Field of Classification Search
CPC ........... H01L 2224/73265; H01L 2224/48227; H01L 2224/131; H01L 22/14; G06K 19/07749; G06K 19/0723; G06K 19/07771
See application file for complete search history.

(56) References Cited

U.S. PATENT DOCUMENTS

| | | | |
|---|---|---|---|
| 7,348,887 B1 * | 3/2008 | Warner et al. ............... | 340/572.3 |
| 7,633,159 B2 * | 12/2009 | Boon et al. ..................... | 257/730 |
| 2002/0079567 A1 * | 6/2002 | Lo et al. ........................ | 257/685 |
| 2004/0185682 A1 * | 9/2004 | Foulke et al. ................. | 438/800 |
| 2006/0126369 A1 * | 6/2006 | Raghuram ....................... | 365/51 |
| 2009/0091026 A1 * | 4/2009 | Fan ................................ | 257/737 |
| 2011/0156033 A1 | 6/2011 | Bintang et al. | |
| 2011/0168784 A1 | 7/2011 | Lin | |
| 2011/0168785 A1 | 7/2011 | Lin | |
| 2011/0168786 A1 | 7/2011 | Lin | |
| 2011/0169115 A1 | 7/2011 | Lin | |
| 2011/0169641 A1 | 7/2011 | Lin | |
| 2011/0233271 A1 | 9/2011 | Lin | |
| 2014/0092576 A1 * | 4/2014 | Lucero et al. ................. | 361/783 |
| 2014/0353384 A1 * | 12/2014 | Hoegerl et al. ............... | 235/488 |

* cited by examiner

*Primary Examiner* — Savitr Mulpuri
*Assistant Examiner* — John M Parker
(74) *Attorney, Agent, or Firm* — Seed IP Law Group PLLC

(57) ABSTRACT

A semiconductor package includes an RFID chip positioned between a first die and a second die attached to a support substrate. The RFID chip is free of electrical connections to the dice and the support substrate. The RFID chip is sized to correspond to an interposer board. Data pertaining to operating characteristics of the dice are stored to and read from the RFID chip during back-end processing to determine abnormalities and improve yield. Said data may be stored to a database corresponding to the RFID chip in the package. A method of making a semiconductor package having an RFID chip positioned between dice is provided. The package is traceable by customers via the data stored to the RFID chip and the database.

6 Claims, 7 Drawing Sheets

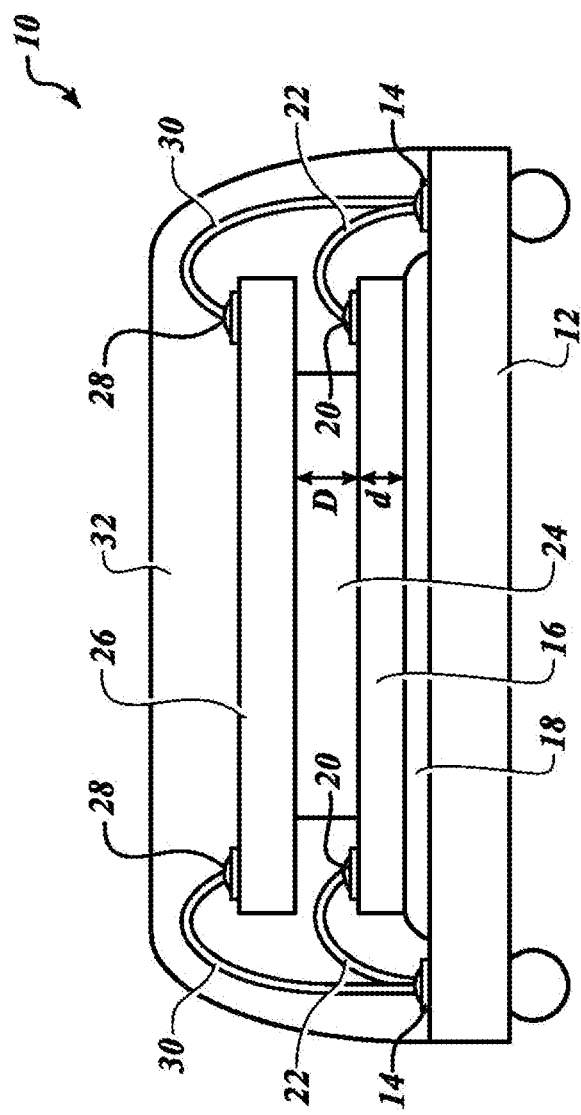

APPARATUS AND METHOD TO ATTACH A WIRELESS COMMUNICATION DEVICE INTO A SEMICONDUCTOR PACKAGE

BACKGROUND

1. Technical Field

This invention relates generally to semiconductor and manufacturing methods thereof, and more particularly, but not exclusively, to a package having an RFID chip positioned between a pair of semiconductor substrates and a method of manufacture.

2. Description of the Related Art

A wafer undergoes many manufacturing processes to form many thousands of devices on it. During and after the manufacturing processes, the wafer is subjected to a series of testing procedures to confirm functionality of the devices, determine speed of operation, and assure quality and reliability. Data of the manufacturing processes and testing procedures are collected and stored in a database that identifies the wafer and each die on the wafer. Such data are stored in correlation with the wafer identification so that the process history and testing results of the devices on the wafer can be tracked as the wafer moves through the process line and toward packaging.

After the wafer is completed, a wafer probe test is carried out in which each die on the wafer is tested for functionality. The functional die may be tested for operational characteristics, and subject to a bin sort, based on various properties, such as memory speed, CPU clock speed, and the like.

After dicing, the non-functional die are discarded and the functional die are sorted into the respective bins, with new identification numbers assigned based on their bin sort properties.

For some types of devices, only a functional test is performed and the die are sorted into two groups: functional and non-functional, and a more detailed bin sort is not carried out.

According to one prior art process, when a wafer is tested at a probe station after it is manufactured, the data is stored in a computer memory as a wafer map that identifies which die on the wafer are defective and which are operational. If the operational die are being sorted into bins, based on such features as memory speed, clock speed, or other factors, this information is also stored on the wafer map. When the wafer is diced at the back-end packaging, each die is assigned a new part number based on the bin sort that was determined. The wafer map is read to identify which dice are to be discarded and which are to be sorted into the different bins. Since the die are assigned new numbers based on the bins sort, the wafer map is no longer useful and tracking the die based on the wafer and lot is no longer carried out.

When the wafers are sawed into dice and packaged into individual units during the packaging process, sometimes called the back-end manufacturing process, the historical wafer information related to each singulated die cannot be tracked any more due to absence of linking between the front-end manufacturing process and the back-end packaging manufacturing process. If a packaged die is later determined as defective or unreliable, it would be desirable to know the full process history and testing results of the die to help track down the problem.

BRIEF SUMMARY

A package includes an RFID chip positioned between a pair of semiconductor substrates of the package. The RFID chip is sized similarly to that of an interposer board. Operational characteristics of the semiconductor substrates are stored on the RFID chip throughout the manufacturing process of the package.

In some aspects, the package includes a package support member having a plurality of bond pads thereon and a first semiconductor substrate having a plurality of logic circuits integrated thereon and a plurality of bond pads thereon. The package includes a first plurality of electrical conductors that extend from the bond pads on the first semiconductor substrate to the bond pads on the package support member. The package includes a second semiconductor substrate having an RFID chip thereon. The second semiconductor substrate is positioned directly overlying the first semiconductor substrate and is free of bond pads. The package includes a third semiconductor substrate having a plurality of logic circuits integrated thereon and a plurality of bond pads thereon. The third semiconductor substrate is positioned directly overlying the second semiconductor substrate. Thus, the second semiconductor substrate has the RFID chip positioned between the first semiconductor substrate and the third semiconductor substrate and holding them a selected distance apart from each other. The selected distance may be the thickness of an interposer board of the package that would have otherwise been included in the package during a manufacturing process. The package includes a second plurality of electrical conductors that extend from the bond pads on the third semiconductor substrate to the package support member. The package includes an encapsulation material that encases the first, second and third semiconductor substrates into a single package with the package support member.

In some aspects, the second semiconductor substrate has a selected thickness equal to or greater than the first semiconductor substrate. In some aspects, the RFID chip is void of electrical connections to the first and third semiconductor substrates and to the package support member.

A method of making a package includes coupling an RFID chip between integrated circuits to track the package and to improve yielding of packages and integrated circuits thereon. In some embodiments, the method includes forming a first plurality of first integrated circuits on a semiconductor wafer and testing each of the first integrated circuits to determine the operating characteristics of each of the first integrated circuits. The operating characteristics of each first integrated circuit are stored in a database. An RFID chip is matched with a particular first integrated circuit and some or all of the stored operating characteristics and an ID code of the matched first integrated circuit are transferred to the RFID chip. The stored operating characteristics may include a bin code pertaining to the matched first integrated circuit. The method includes attaching the RFID chip to the matched integrated circuit. A plurality of second integrated circuits are formed on a semiconductor wafer and each of the second integrated circuits are tested to determine the operating characteristics of the second integrated circuits. A single one of second integrated circuits is attached on top of the RFID chip. The second integrated circuit may be selected based on a bin code that corresponds to the bin code of the first integrated circuit. Thus, the first and second integrated circuits may have the same or similar operating characteristics, which can drastically affect the operability of the package combination, and therefore, the value of the package in the marketplace. The operating characteristics of the attached second integrated circuits are stored in the RFID chip. The first integrated circuit, the RFID chip and the second integrated circuit are then encapsulated into a single package.

An RFID wafer includes a plurality of RFID chips wherein a single one of the RFID chips is matched and included into a particular package. Unique ID information may be stored to each RFID chip while attached to each other on the RFID wafer. The RFID wafer is processed into individual RFID chips either before or after being matched with a respective integrated circuit. The processing includes back grinding the RFID to a selected thickness and then sawing the RFID wafer into individual RFID chips for attachment to a package.

It will be appreciated that the packages discussed in the present disclosure may include multiple integrated circuits that are each tested and attached to the board which is included in the package based on individual operating characteristics. Thus, the RFID chip may be positioned between any pair of integrated circuits. The information pertaining to each integrated circuit of the entire package may be stored on a database for analysis and/or may be stored on the RFID chip at any point during and after manufacturing of the package.

The present disclosure provides many advantages. For example, because a particular RFID chip is positioned inside the package and includes operating characteristic information pertaining to at least one integrated circuit, the yield of a plurality of integrated circuits and/or packages improves. This is because the highest quality of integrated circuits can be included into one package due to the ability to individual track each integrated circuit and store and read information from the RFID chip pertaining to each integrated circuit. Furthermore, counterfeiting of packages is reduced because the final packages have a readable RFID chip inside the package, which allows any person with an interrogator to read information pertaining to the package or plurality of packages. In addition, by replacing a typical interposer board with an RFID chip having the same size and dimensions of the interposer board, the height and dimensions of the package are unchanged, which is advantageous because there is no requirement to redesign the architecture of the die technology process.

Another advantage is that the stored information pertaining to the integrated circuits can be used by a computer system to compare and analyze the operability of a plurality of particular integrated circuits, which can be used to change or otherwise modify the die technology process, including determining semiconductor wafers and circuits having abnormalities before they are processed and included into a package. Thus, defective packages are not shipped to customers. However, if a package is shipped to a customer, the package includes single device traceability in that it can be traced back to individual processes and particular wafers and integrated circuits because the information pertaining to the package is stored on the RFID chip in the package (and perhaps also on a database for retrieval and analysis). Such traceability of millions of packages is very important, for example, for faulty packages in products requiring product recalls and for medical device tracking.

BRIEF DESCRIPTION OF THE SEVERAL VIEWS OF THE DRAWINGS

For a more complete understanding of the present disclosure, and the advantages thereof, reference is now made to the following descriptions taken in conjunction with the accompanying drawings, in which:

FIG. 1A is a front elevational view of a package, according to an embodiment;

DETAILED DESCRIPTION

The making and using of embodiments are discussed in detail below. It should be appreciated, however, that specific embodiments discussed are merely illustrative, and do not limit the scope of the invention.

Figure 1B:
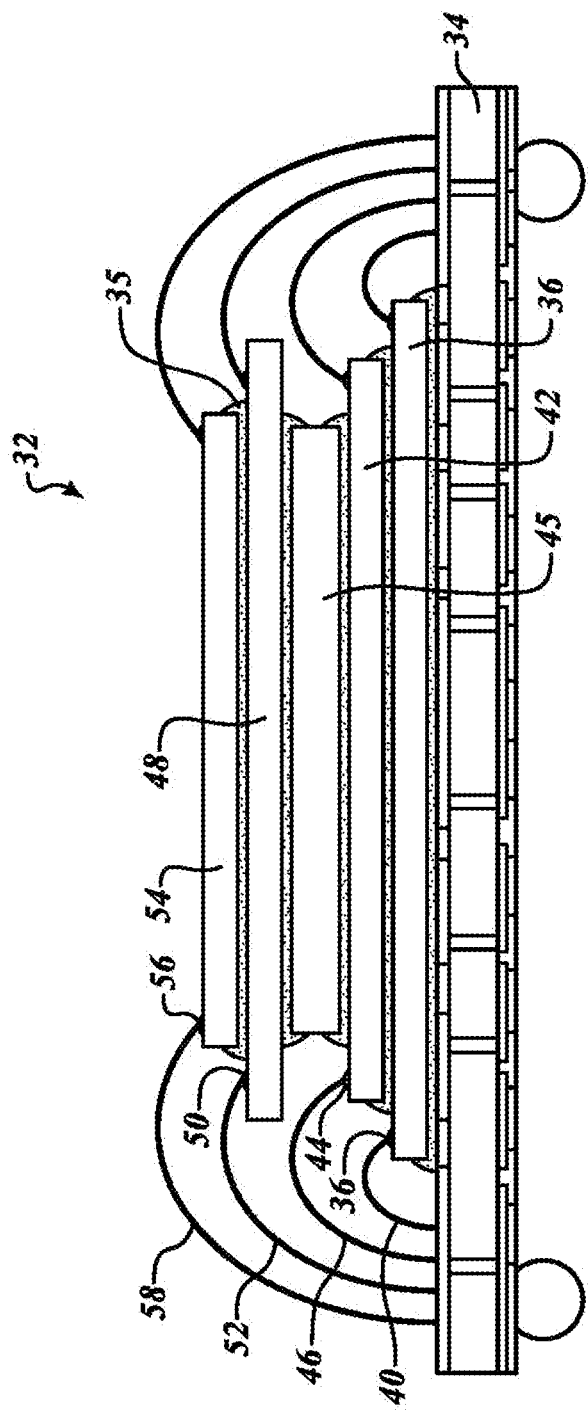
FIG. 1B is a cross sectional view of a package, according to an embodiment.
Figure 2:
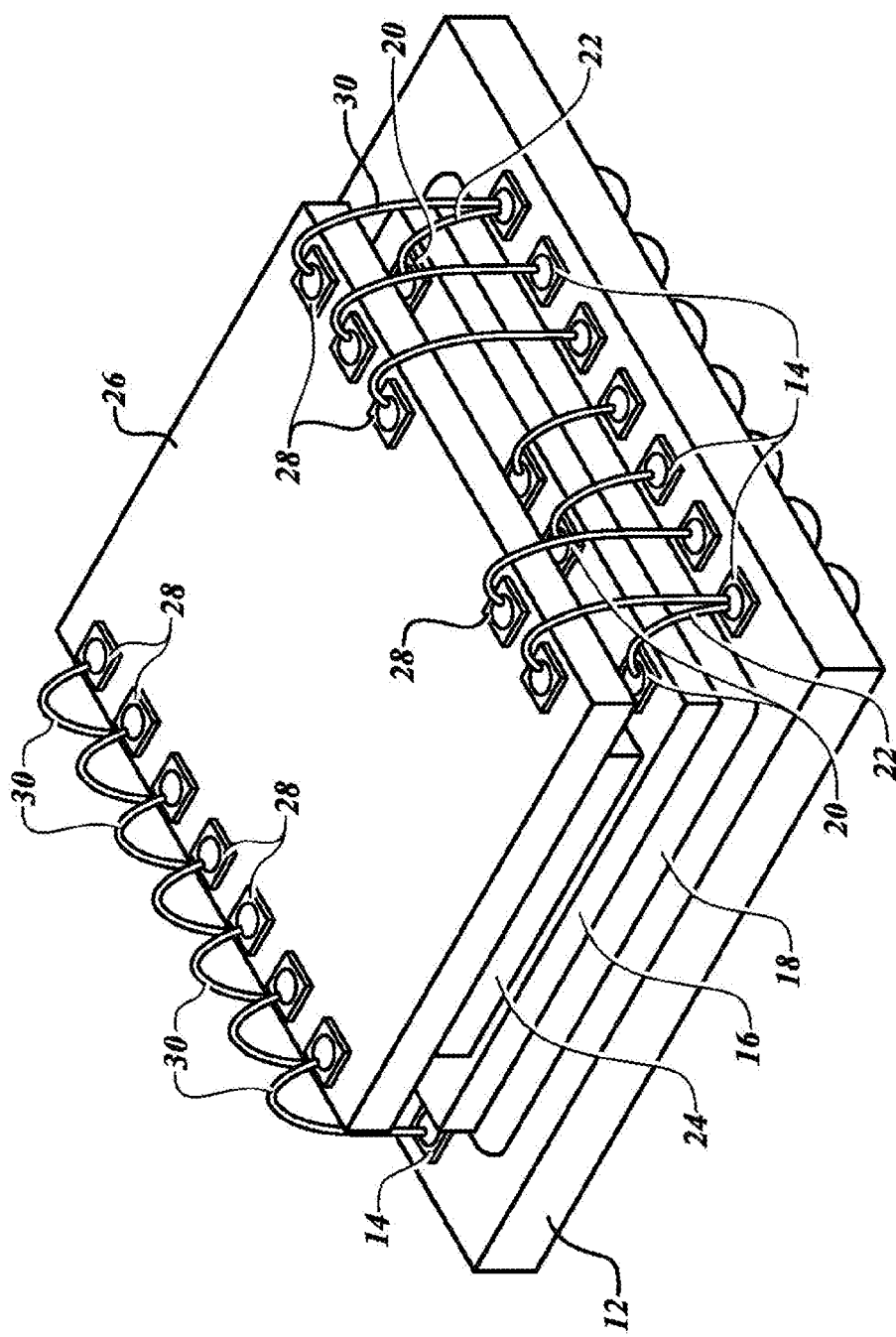
FIG. 2 is an isometric view of the package of FIG. 1A.

FIGS. 1A and 2 show a package 10 according to an aspect of the present disclosure. The package 10 includes a package support member 12 having a plurality of bond pads 14 thereon. A first semiconductor substrate 16 is attached to the package support member 12. An adhesive material 18 may be positioned between the first semiconductor substrate 16 and the package support member 12. The adhesive is conductive in one embodiment and non-conductive in another embodiment. The first semiconductor substrate 16 includes a plurality of logic circuits integrated thereon (not shown) and a plurality of bond pads 20 thereon. The package 10 includes a first plurality of electrical conductors 22 that extend from the bond pads 20 on the first semiconductor substrate 16 to the bond pads 14 on the package support member 12.

A second semiconductor substrate or RFID chip 24 is positioned directly overlying the first semiconductor substrate 16 and is free of bond pads. A third semiconductor substrate 26 includes a plurality of logic circuits integrated thereon (not shown) and a plurality of bond pads 28 thereon. The third semiconductor substrate 26 is positioned directly overlying the RFID chip 24. The package 10 includes a second plurality of electrical conductors 30 that extend from the bond pads 28 on the third semiconductor substrate 26 to the package support member 12. Thus, the RFID chip 24 is positioned between the first semiconductor substrate 16 and the third semiconductor substrate 26 and holds them a selected distance apart from each other.

In some aspects, the RFID chip 24 has a selected thickness D equal to or greater than a thickness d the first semiconductor substrate 16. The selected thickness D may be the thickness of an interposer board that would have otherwise been included in the package during a manufacturing process.

In one embodiment, the RFID chip 24 is void of electrical connections to the first and third semiconductor substrates 16, 26 and to the package support member 12.

The package 10 includes an encapsulation material 32 that encases the first and third semiconductor substrates 16, 26 and the RFID chip 24 into a single package 10 with the package support member 12.

FIG. 1B is a cross sectional view of a package 32 according to an embodiment. The package 32 includes a package support member 34 having a plurality of bond pads thereon, such as shown on FIG. 1A. A first semiconductor substrate 36 is attached to the package support member 34. The first semiconductor substrate 36 includes a plurality of logic circuits integrated thereon (not shown) and a plurality of bond pads 38 thereon. The package 32 includes a first plurality of electrical conductors 40 that extend from the bond pads 38 on the first semiconductor substrate 34 to the bond pads on the package support member 34. A second semiconductor substrate 42 includes a plurality of logic circuits integrated thereon (not shown) and a plurality of bond pads 44 thereon. The package 32 includes a second plurality of electrical conductors 46 that extend from the bond pads 44 on the second semiconductor substrate 42 to the bond pads on the package support member 34. The second semiconductor substrate 42 directly overlies the first semiconductor substrate 36. A third semiconductor substrate having RFID chip 45 is positioned directly overlying the second semiconductor substrate 42 and is free of bond pads. A fourth semiconductor substrate 48 includes a plurality of logic circuits integrated thereon (not shown) and a plurality of bond pads 50 thereon. The package 32 includes a third plurality of electrical conductors 52 that extend from the bond pads 50 on the fourth semiconductor substrate 48 to the bond pads on the package support member 34. The fourth semiconductor substrate 48 is directly overlying the RFID chip 24. Thus, the RFID chip 24 is positioned between the second semiconductor substrate 42 and the fourth semiconductor substrate 48 and holds them a selected distance apart from each other. A fifth semiconductor substrate 54 includes a plurality of logic circuits integrated thereon (not shown) and a plurality of bond pads 56 thereon. The package 32 includes a fourth plurality of electrical conductors 58 that extend from the bond pads 56 on the fifth semiconductor substrate 54 to the bond pads on the package support member 34. A substrate material 35 may be positioned between each of the semiconductor substrates 36, 42, 45, 48, 54, and between the package support member 34 and the first semiconductor substrate 36, as shown by the substrate material 35 disposed between the fourth and fifth semiconductor substrates.

The location and dimensions of the RFID chip 24 of FIGS. 1A and 45 of FIG. 1B are selected to achieve a number of desired results. In some chip structures previously made, it was sometimes required to place an interposer board or some other kind of spacing structure between two adjacent semiconductor chips that were stacked on top of each other. Such an interposer board would provide a few benefits, among them better spacing of the vertical contact pads 20 and 28 so that bonding wires could more easily be coupled between the two respective semiconductor dies 16 and 26 and a substrate 12. Another benefit of an interposer board is that it permits heat to be more easily transferred out of the semiconductor chip during operation. There are other advantages to having an interposer board.

According to principles of the various embodiments as newly disclosed herein, the RFID chip, whether 24 or 45, is made substantially thicker than needed for a standard RFID chip. As is well known in the art, an RFID chip is traditionally a very small chip, and it usually has a lower height and much smaller dimensions than a standard full-size semiconductor wafer. However, in the present embodiments, the RFID chip 24 and 45 is constructed using a semiconductor wafer, such as silicon, and has a thickness which is thicker than the semiconductor chips which are below it or above it. Further, it has dimensions which are approximately the same as those of the semiconductor chips which are above it and below it, but slightly less, so as to provide room for bonding wires to the adjacent chips, in the case of FIG. 1B to chips 42 and 48. The RFID chip 45 therefore provides spacing between chips 48 and 42 to permit heat dissipation and also provide room in which electrical connections 46 and 52 may be easily made to adjacent semiconductor chips 42 and 48.

The use of interposer board 24 and 45 permits a chip 48, which is vertically above another chip 44, to be approximately the same dimensions as the lower chip, and in some instances have a larger width or length. Without the interposer board, it would normally be required that every chip which is stacked on top of another chip be smaller in length or width, or both, than the chip it is over. For example, as can be seen in FIG. 1B, chip 42 is smaller in width than chip 36 so that bonding wire 40 can easily be connected to chip 36 without interference from chip 42. However, chip 48, which is overlying chip 42, can have the same dimensions as chip 42 or, in some instances, can have both a length and a width which is larger. Because the RFID chip 45 is positioned between them, sufficient spacing is provided so that even if chip 48 has the same width, the same length, or greater width and greater length than chip 42, there is sufficient room in which bonding wires 46 may be connected to chip 42. This can also be seen in the embodiment of FIG. 1A in which the chip 26 overlying chip 16 is approximately the same dimensions. In an alternative embodiment, the overlying chip is even larger in length or width or both. Of course, it is not required that the overlying chip be larger, and it can, in fact, be smaller, similar to the difference in dimensions between chip 36 and 42; however, the presence of interposer board 45 provides greater flexibility in selecting the dimensions of an overlying chip 48 which is above one or more other chips. By intentionally making RFID chip 45 thicker than most RFID chips, additional benefits are therefore obtained beyond that which would be obtainable merely by providing an RFID chip in the package.

Figure 3:
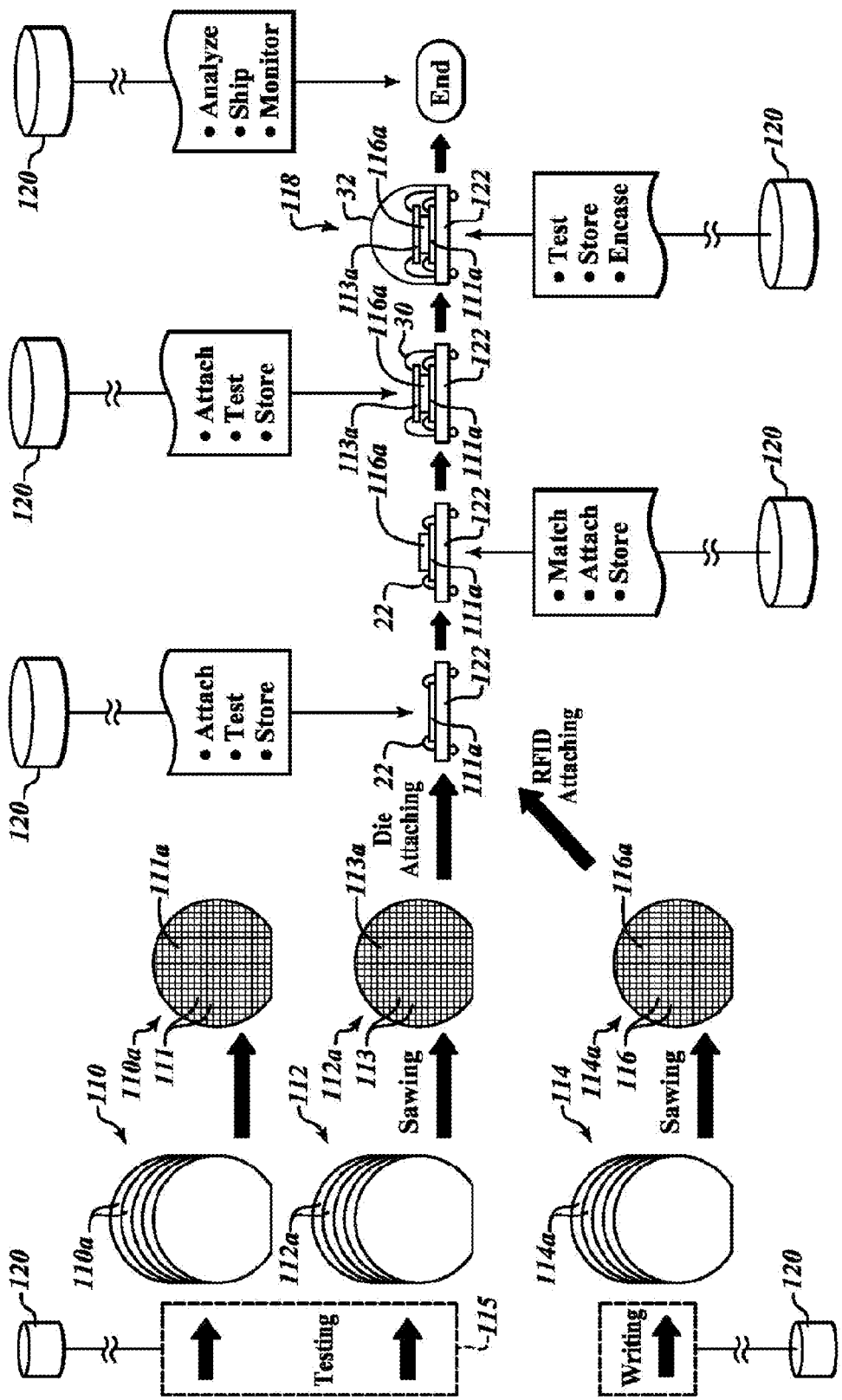
FIG. 3 is a flow chart of a method of manufacturing a package having an RFID chip, according to an embodiment.

FIG. 3 is a schematic view of packaging dice having an RFID chip according to an embodiment. Some aspects of FIG. 3 are shown in previously published application number US2011-0156033, which does not disclose the use of an RFID chip as part of the manufacturing process. FIG. 3 shows a plurality of first wafers 110a grouped according to a first lot 110 and a plurality of second wafers 112a grouped according to a second lot 112. Wafer 110a includes a plurality of die 111 and wafer 112a includes a plurality of die 113. A plurality of RFID wafers 114a are grouped into an RFID lot 114. Each RFID wafer 114a includes a plurality of RFID chips 116. As wafer 110a, 112a and RFID wafer 114a travel through the semiconductor manufacturing line, various processes are carried out to form a package 118 having an RFID chip 116a installed in the package 118 and between a die 111a and die 113a, as further discussed herein.

In each lot 110, 112, and 114 there may be 25 wafers in some front end technologies. In other manufacturing front ends, the lot size may vary from a small one wafer per lot to in the range 10 to 25 wafers per lot. As wafers in each lot travel through the semiconductor manufacturing line, various processes are carried out to form the integrated circuits thereon. At various stages during the manufacturing process, the wafers are subjected to various tests for functionality and to determine specific process parameters. The results of these tests are typically stored in a wafer map for each wafer.

Along the entire manufacturing process of the present example and as a general example, the RFID chip 116a is matched to the operating characteristics of die 111a and die 113a and is positioned therebetween. Such information pertaining to said operating characteristics is stored to the RFID chip 116a and an external database 120. Thus, the package 118 includes information on the RFID chip 116a pertaining to the entire manufacturing process of each die in the package, including the operating characteristics of each die. This provides the advantage of tracing back each die in each package. This also provides an advantage in determining counterfeit packages because an RFID reader can retrieve the stored information on the RFID chip of each package and determine its origin and operability at the time of manufacture. Moreover, if there is no RFID chip in the package and it is known that the manufacturer only ships certain packages with RFID chips therein, then it can easily be determined that the package is counterfeit due to the nonexistence of an RFID chip in a counterfeit package.

After the manufacturing process of each wafer is complete, each wafer 110a, 112a is subjected to a wafer probe test 115 in which the wafers are tested to determine functionality and, if functional, various operating parameters. At the wafer probe testing 115 of the each wafer, further data for the wafer map is generated and stored. According to one embodiment of the invention, the wafer map stores, for each wafer 110*a*, 112*a*, the particular identity of the wafer, the lot number of the wafer, and a complete tracking of the full manufacturing process for that particular wafer, including the results of specific tests carried out during the manufacturing process. The wafer map also contains location information, for example, the x and y coordinates, of each individual dice 111, 113 on each wafer 110*a*, 112*a*.

The RFID wafers 114*a* include a plurality of RFD chips 116 that each have at least an antenna and a memory coupled to the antenna. Advantageously, data pertaining to some or all of the information of the wafer map for a particular die is stored to a particular RFID chip 116 for matched individual die 111, 113 of a particular package 118. For example, after the wafer probe testing 115 of a wafer 110*a*, a particular die 111*a* is matched to a particular RFID chip 116*a* and the data corresponding to die 111*a* is stored to the RFID chip 116*a*. The same operation may occur for a particular die 113*a* on wafer 112*a*, particularly the die 113*a* is matched to the RFID chip 116*a* and the data corresponding to die 113*a* is stored to the RFID chip 116*a*. Accordingly, the RFID wafer 114*a* has a plurality of RFID chips 116 that are each individually matched to particular dice 111 of the wafer 110*a* and to a particular dice 113 on wafer 112*a*.

The wafers 110*a*, 112*a*, together with the RFID wafer 114*a*, are transferred to a back-end processing location for dicing and packaging. In some situations, the back-end dicing and packaging operation are within the same company, while in other embodiments, the back-end processing is in a separate country and may be carried out by a completely separate company from the company which made the wafer. For example, companies such as IBM and STMicroelectronics have their own back-end packaging facilities at which their own wafers are tested, diced and packaged. In other instances, a wafer made by a company such as Freescale, Texas Instruments, or TSMC is sent to semiconductor packaging and assembly test specialty companies such as Amkor, Advanced Semiconductor Engineering, or STATS ChipPAC for dicing and packaging. In some cases, the wafer probe testing and generation of the wafer map are done by the specialty package company and not by the company that made the wafer.

After being diced into individual die 111, 113, and after being diced into individual RFID chips 116, the dice and RFID chip are placed on a support member. For purposes of illustration, a support member 122 is shown as a single support member for a single package. It will be appreciated that the back-end processing operations typically include a support member comprised of a plurality of die attaching locations for manufacturing a plurality of packages from said support member. As such, the support member is the lead frame having a downset die pad and individual lead fingers, for each die support unit, as is known in the art. In other embodiments, the support member is a printed circuit board for a ball grid array or a flip chip, while in other embodiments, it is a dielectric carrier plate to support the die while a molding compound is applied and it is later removed. Lead frames are currently constructed with a large number of configurations including dual inline packages (DIPs); small outline integrated circuit packages (SOICPs); quad flat pack (QFPs), including standard quad flat packs and thin quad flat packs (TQFPs); thin shrink small outline packages (TSSOPs); power SOP packages; micro lead frame packages; and a number of other lead frame configurations. Support members are also provided for chips packaged using ball grid arrays or LAN grid arrays. These include various types of packages, including PBGA, CABGA, CTBGA, SBGA, and a number of other configurations. In addition, the support member may be in the form of a flip chip substrate of a type well known in the art including such packages as a flip chip CSP, a flip chip ball grid array, and other configurations. In other instances, the support member may be a carrier onto which the die are adhered by a tape layer and subsequently encapsulated while mounted on the carrier. The packaged die may be later singulated after removal from the carrier, the die support units being constructed on the die while it rests on the carrier. In each of these different types of packages, the support member 122 shown has a support substrate which may be a metal lead frame, a printed circuit board, an insulating laminate layer or another type of material which is organized having locations for a large number of die support units thereon.

As illustrated on FIG. 3, after the die 111, 113 are diced by sawing the wafers at the scribe lines, an individual die 111*a* is attached to the support member 122. A first plurality of electrical conductors 22 of the die 111 are connected to the bond pads on the support member 122 (FIGS. 1A and 2). The die 111*a* is tested to determine its operating characteristics, which are then stored on a matched RFID chip 116*a* (the operating characteristics may also be stored on an external database 120). Next, the matched RFID chip 116*a* is positioned directly overlying the die 111*a*. As illustrated in FIGS. 1A and 2, the RFID chip 116*a* is free of bond pads. Next, the die 113*a* is positioned directly overlying the RFID chip 116*a*. A second plurality of electrical conductors 30 of the die 113*a* are connected to the support member 122. The die 113*a* is tested to determine its operating characteristics, which are stored on the RFID chip 116*a* (and optionally stored on the external database 120). Finally, an encapsulation material 32 encases the dice 111*a*, 113*a* and the RFID chip 116*a* into a single package 118 with the package support member 122. It will be appreciated that the information may be stored to the RFID chip 116*a* as early as when the RFID wafer 116 is first processed, to as late as when the final package is encapsulated, or at any time between.

The introduction of an RFID chip in the middle of the package assembly line has significant advantages with respect to tracking the individual die and also the storage of data. In one embodiment, when wafer 110*a* remains in wafer form and wafer 114*a* remains in wafer form, all of the die in each of the wafers are tested to determine the operating characteristics of the logic circuit found on die 111 as well as the operating characteristics of the RFID 116. In the wafer state, the operating die 111 are matched to the operating RFID chips 116, after which, the wafers are respectively diced and preparations are made for assembly of the package. The operating die 111 is placed on the package support 122, which may be a standard wire frame, a flip chip support substrate, a PCB, or any of the number of well-known packaging supports which may be used. In one embodiment, since all the testing has already been performed while the die 111 was in the wafer state, no additional testing is needed, and the matched RFID chip 116 is then attached directly above the logic die 111. In an alternative embodiment, some additional testing and storing may occur after the die 111 is attached to the support 122.

After the RFID die 116*a* is attached to the matched logic die 111*a*, the code that identifies the particular logic die 111*a* is stored into the RFID tag 116*a*. As stated, this storage may occur either before or after the attaching of the dies to each other. The RFID chip 116*a* therefore contains all of the identification data for tracking the die 111*a* to which it is attached. In the prior art, it was necessary to have some kind of external marking such as a printed board or other tag which traveled with substrate 122 in order to identify the individual die 111*a* to match it with the stored data from its original test. The presence of RFID tag 116*a* makes it no longer necessary to mark the substrate 122 or any of the other material that travels along the assembly line with the die 111*a*. The RFID chip 116*a* stores sufficient identification data of the die 111*a* that the die can be individually identified, and the testing data stored in the wafer map can be located as stored in database 120. Thus, while it is permitted to store all of the testing data in the RFID chip 116*a*, if there is sufficient memory in one embodiment, in an alternative embodiment it is only necessary to store sufficient information in the memory of RFID chip 116 to uniquely identify the die 111*a* to which it is attached, and then this information is used to locate the operating characteristics of the die 111*a* as stored in the wafer map testing data in external database 120.

After the RFID chip 116*a* is connected to the logic die 111*a*, it travels to the next station in the manufacturing process. At the next station, one of a number of different steps may take place. In one embodiment, encapsulation may take place, and after encapsulation, the RFID tag is interrogated to determine the identity and bin sort of the logic chip 111*a*, after which the package is appropriately marked to indicate the operating characteristics, processing speeds, and other identification of the chip 111*a* which is inside the package.

In another alternative embodiment, as the combination of the support 122, the die 111*a*, and the RFID chip 116*a* approach the next station, the RFID chip 116*a* is interrogated to determine the identity of the logic die 111*a* to which it is attached. Once the identity is exactly known, the operating characteristics of the die 111*a* are accessed, either directly from their RFID chip 116*a* or by retrieving it from the external database 120. Once the operating characteristics of the die 111*a* are known, then a matching die 113*a* is selected to place into the same package, having similar operating characteristics in order to ensure that the completely packaged sets of die have compatible and, preferably, similar operating characteristics to enhance the commercial value of the final package. The presence of the RFID chip 116*a* therefore provides the benefit that the RFID tag 116*a* can be read at various times during the manufacturing process in order to understand and identify the identity of chips 111*a* and 113*a* in the package and then when later chips are added, such as two, three, four, or more chips as shown in FIG. 1B, the RFID tag 116*a* can be interrogated before each of the die are added in order to understand the identity and operating characteristics of the die presently in the combined package, so that appropriate decisions can be made in adding additional die to the same package. Examples of the types of decisions which may be made will now be made.

In many instances, users will pay additional money for extremely fast chips, or chips which have high power or higher frequency operating characteristics. On a single wafer 110*a*, adjacent die 111 may have different operating speeds, different operating frequencies, or different operating power draws, depending on minor variations in the manufacture of the die, even though they went through the same manufacturing process. Accordingly, some die 111*a* on the wafer 110*a* are faster in response time, or have higher operating frequencies than other die on the same wafer. Many customers desire to purchase the die which have the enhanced operating characteristics such as higher speed, and will pay a higher price for such die. Accordingly, a bin sort is performed which identifies the die which have these enhanced operating characteristics and the faster speeds, and these are identified in the wafer test, and their identity is stored in the external database 120. Such identity will be stored on the RFID tag 116*a*. Then, at a later stage in the process, an additional die 113*a* is to be attached to the package. If the die 111*a* which is attached is a high-speed die which has faster operating characteristics than other die in the lot, it is preferred to match another high-speed die 113*a* to the same package so that the two together have a higher operating speed than if a slow die 113*a* were attached to the operating die 111*a*. This will provide enhanced operation of the completely packaged unit of dies 111 and 113*a* and both together will operate at a higher operating speed than if either one of them were a slower chip. Namely, if the die 113*a* which is attached to the die 111*a* has a bin sort which is a much slower operating speed, or operates at different frequencies which are not as desirable, it may be that the additional benefit of having a fast chip 111*a* has been lost because it is matched to a chip 113*a* which is not as fast in operation. Thus, the packaged combination 118 would not have the increased value. According to principles as taught herein, the RFID tag 116 identifies whether the chip 111*a* has a bin sort of very fast, medium fast, or standard. The chip 113*a* which is then matched and packaged in the same package will be selected then to have a similar bin sort so that a very fast die 113*a* is matched to a very fast die 111*a*, and a fast die 111*a* is matched to a fast die 113*a*, and a standard operating speed die 111*a* is matched to a standard operating speed die 113*a*. Since the RFID chip 116*a* contains all of the data necessary to individually identify the die 111*a* and 113*a*, selections can be made to ensure that the chips are properly matched during the manufacturing process. Such matching can be carried out for subsequence logic die which are attached, such as additional die 48 and 54 as shown in FIG. 1B.

Advantageously, if the die 111*a* is found to be defective, such information may be stored to the RFID chip 116*a* after testing die 111*a*. Thus, before the next step in a process (e.g., attaching a second die 113*a*), the RFID chip 116*a* is interrogated and it will be determined by the system that the die 111*a* was defective. Accordingly, the second die 113*a* will not be stacked and the process for that particular package will not be completed. Moreover, information pertaining to the defective die can be traced back via the RFID chip to the beginning of the manufacturing of said die on a particular wafer. As such, the system will make appropriate adjustments to not attach additional defective die to any packages. Thus, yield rates are improved due to the traceability of the die via the data stored and read on the RFID chip before the package is completed and shipped to customers. In addition, once the package is shipped, it may be monitored throughout the life of the package because the RFID chip includes information pertaining to the package and the individual die therein. Such information may also be retrievable from the external database having information linked to the particular RFID chip in the package.

In the event a customer has questions after the purchase of a product, even several years later, the RFID chip 116*a* in the package 118 provides sufficient indication that the particular lot of the wafer, the wafer number within the lot, as well as the exact location of the specific die on the specific wafer can be determined and a match made to the wafer map that is stored for that particular die and that particular wafer. Such wafer map data may include the various testing that was carried out on that particular die through the entire manufacturing process and at the wafer probe test. Even if the RFID chip does not have a large enough memory to contain all the data about the dice in the package and the package itself, the external database can be accessed to retrieve all the data linked to the particular RFID chip in the particular package to be assessed.

Figure 4:
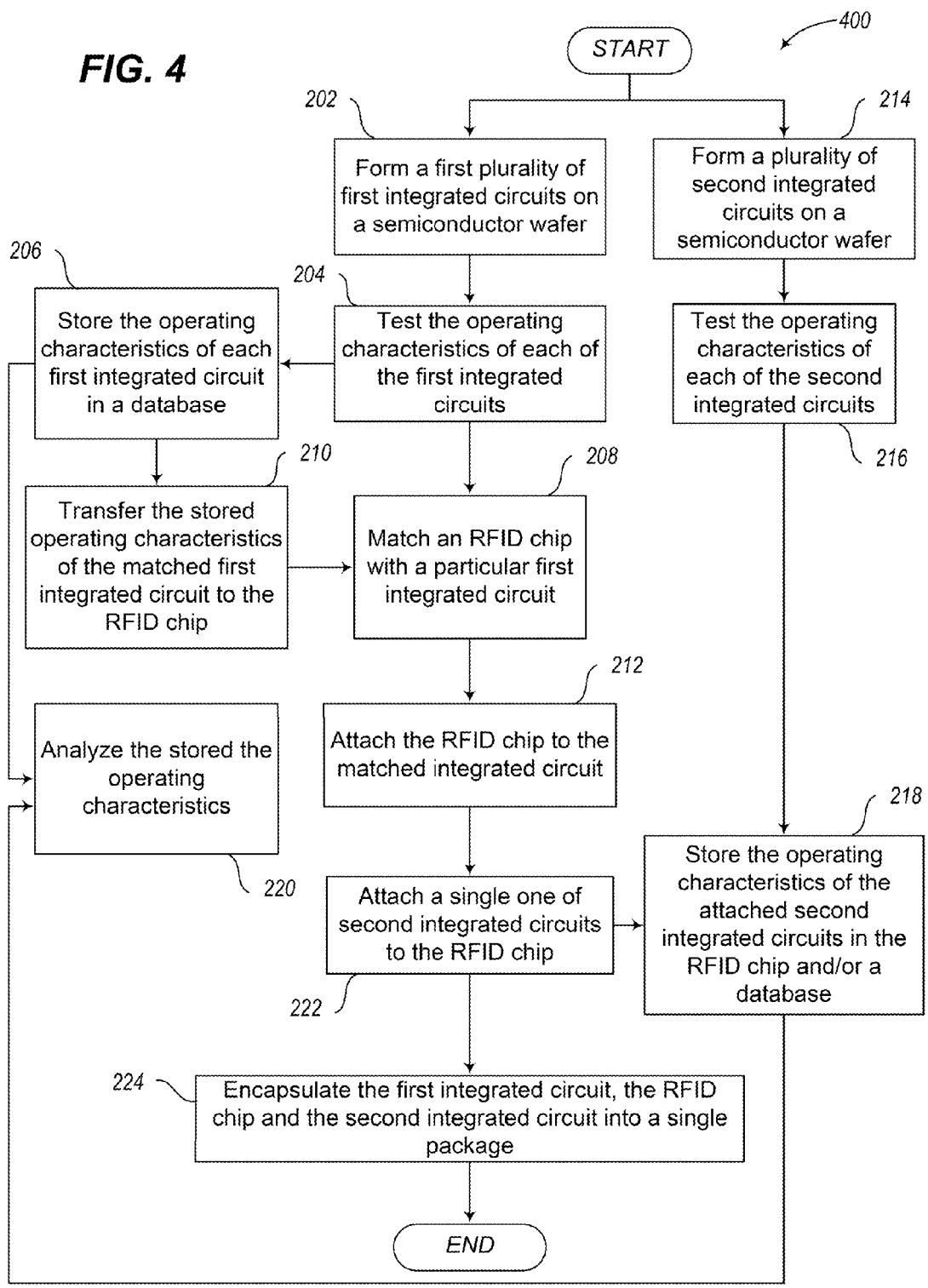
FIG. 4 is a flow chart of a method of manufacturing a package having an RFID chip, according to an embodiment.

FIG. 4 shows an example embodiment of a process 400 of making a package 118, which includes some or all of the steps and features discussed with reference to FIGS. 1A-3. In step 202, a first plurality of first integrated circuits are formed on a semiconductor wafer, such as wafer 110a of FIG. 3. In step 204, the operating characteristics of each of the first integrated circuits are tested. In step 206, the operating characteristics of each first integrated circuit are stored in a database. In step 208, an RFID chip is matched with a particular first integrated circuit, such as RFID chip 116a. In step 210, the stored operating characteristics of the matched first integrated circuit are stored to the RFID chip. In step 212, the RFID chip is attached to the matched integrated circuit. The matched integrated circuit and RFID chip may both be attached to a package support.

In step 214, a plurality of second integrated circuits is formed on a semiconductor wafer, such as on wafer 112a of FIG. 3. In step 216, the operating characteristics of each of the second integrated circuits are tested. In step 218, the operating characteristics of the attached second integrated circuits are stored to the RFID chip and to a database. In step 220, the stored operating characteristics of the first and second integrated circuits may be analyzed by a computer system to determine if abnormalities exist in the wafers and dice. In step 222, a single one of second integrated circuits is attached to the RFID chip. In step 224, the first integrated circuit, the RFID chip and the second integrated circuit are encapsulated into a single package, such as the packages of FIGS. 1A-3.

Figure 5:
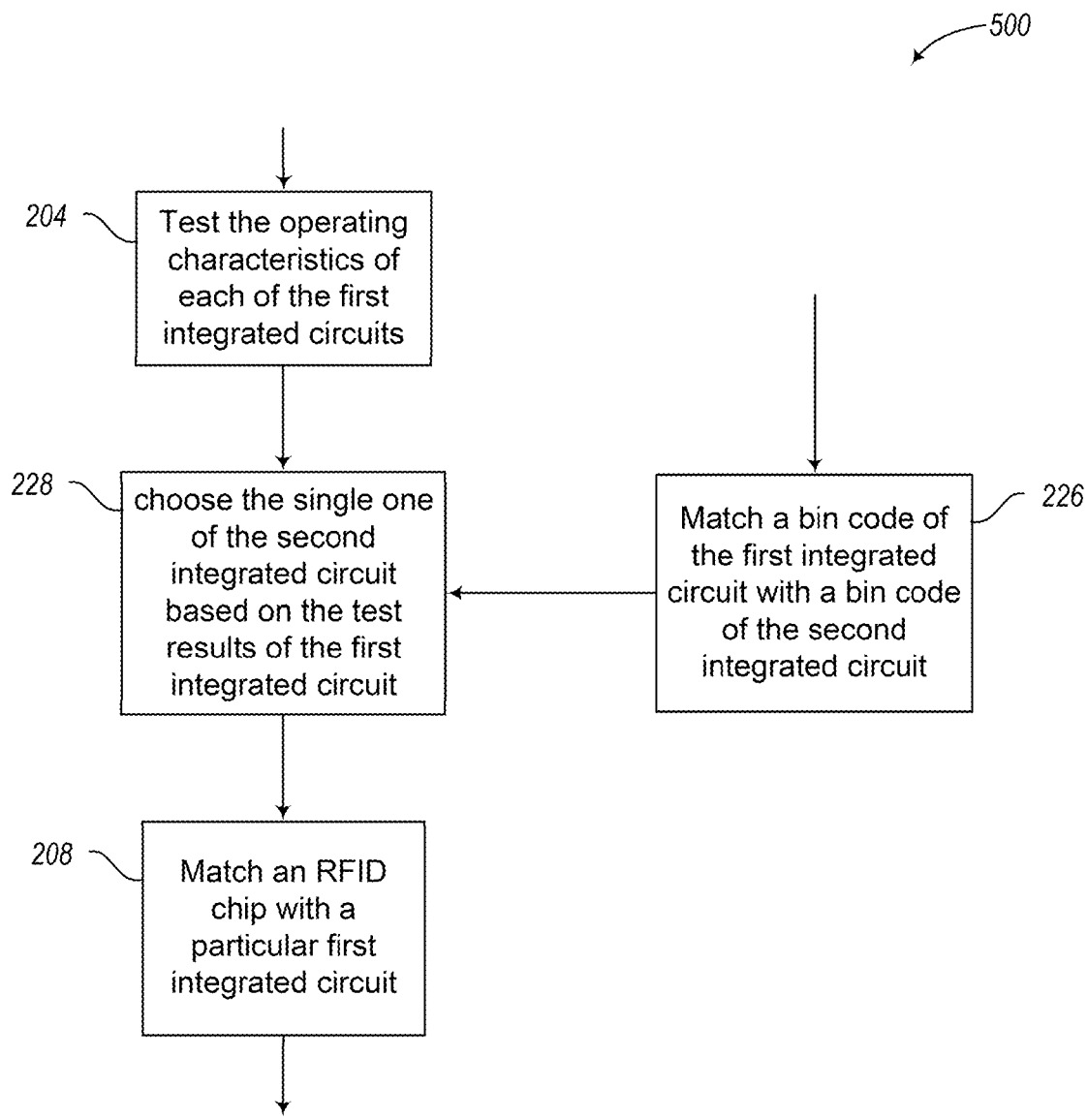
FIG. 5 illustrates an example flowchart according to the embodiment illustrated in FIG. 3.

FIG. 5 shows example operations 500 carried out after or concurrently with step 204 (testing operating characteristics of each of the first integrated circuits). In step 226, a bin code of the first integrated circuit is matched with a bin code of the second integrated circuit. In step 228, the single one of the second integrated circuit is chosen based on the test results of the first integrated circuit. In step 208, the RFID chip is matched with the particular first integrated circuit, and the manufacturing process may continue as shown on FIG. 4. Accordingly, a package can be built that includes only dice derived from a particular bin, and consequently, dice having similar operating characteristics. Importantly, such information is stored to the RFID chip contained within the package.

Figure 6:
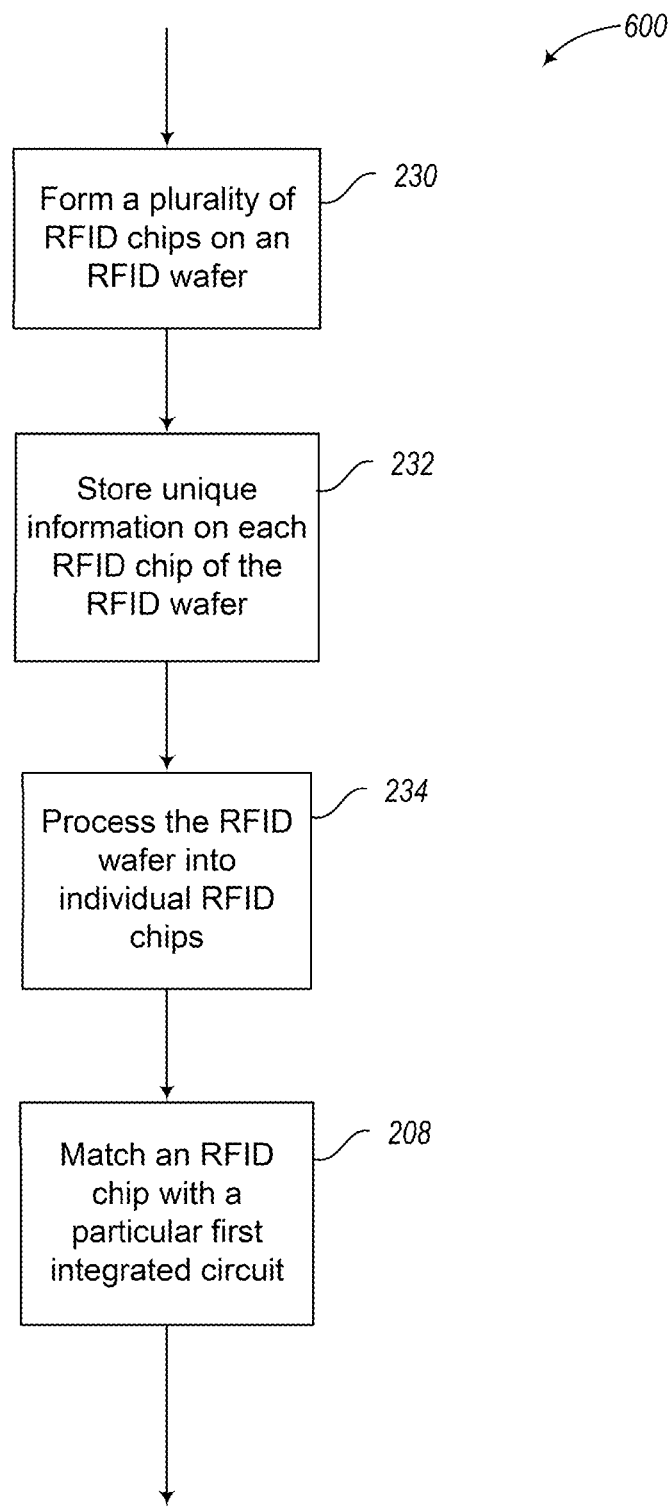
FIG. 6 illustrates an example flowchart according to the embodiment illustrated in FIG. 3.

FIG. 6 shows example operations 600 carried out before or concurrently with step 208 (matching an RFID chip with a particular first integrated circuit). In step 230, a plurality of RFID chips are formed on an RFID wafer, such as the RFID wafer 114a of FIG. 3. In step 232, information is stored on each RFID chip of the RFID wafer; the information corresponds to information of the first integrated circuit. In step 234, the RFID wafer is processed into individual RFID chips. In step 208, the RFID chip is matched with the particular first integrated circuit, and the manufacturing process may continue as shown on FIG. 4. The RFID wafer and chips may be formed and processed at any point before the RFID chip is attached to the particular first integrated circuit, and the RFID chip may have data stored thereon (or read therefrom) at any point during the manufacturing process.

Because a wirelessly readable and writable device is installed within a package, there is no longer the requirement to mark the outside of the package with a numbering scheme or table in order to provide single device traceability for the package. This further prevents counterfeiting because there are no markings on the package to counterfeit in the first place; there is only a readable RFID chip that contains information pertaining to the package and dice therein.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
   a package support member having a plurality of bond pads thereon;
   a first semiconductor integrated circuit die having first unique characteristics, a first plurality of logic circuits integrated thereon and a plurality of bond pads thereon;
   a first plurality of electrical conductors that extend from the bond pads on the first semiconductor die to the bond pads on the package support member;
   a second semiconductor substrate having an RFID circuit thereon and having a non-transitory memory thereon, the second semiconductor die being positioned directly overlying the first semiconductor die and being free of bond pads;
   a third semiconductor die having second unique characteristics, a second plurality of logic circuits integrated thereon and a plurality of bond pads thereon, the third semiconductor die being positioned directly overlying the second semiconductor substrate, with the second semiconductor die being positioned between the first semiconductor die and the third semiconductor die and holding them a selected distance apart from each other;
   a second plurality of electrical conductors that extend from the bond pads on the third semiconductor die to the package support member;
   an encapsulation material that encases the first semiconductor die, second semiconductor substrate, and third semiconductor die into a single package with the package support member; and
   data corresponding to the first and second unique characteristics being stored in the non-transitory memory of the second semiconductor substrate.

2. The apparatus of claim 1 wherein the second semiconductor substrate has a selected thickness equal to or greater than the first semiconductor die.

3. The apparatus of claim 1 wherein the second semiconductor substrate has a selected footprint surface area that is between 10 percent and 30 percent smaller than the footprint surface area of the first semiconductor die.

4. The apparatus of claim 1 wherein the second semiconductor substrate has a selected footprint surface area that is approximately 20 percent smaller than the footprint surface area of the first semiconductor die.

5. The apparatus of claim 1 wherein the first characteristics include at least one of a wafer lot number, a wafer number, a position in a wafer, and an operating speed of the first semiconductor die.

6. The apparatus of claim 1 wherein the RFID chip is void of electrical connections to the first and third semiconductor die and to the package support member.

* * * * *